(12) United States Patent
Low et al.

(10) Patent No.: US 10,424,492 B2
(45) Date of Patent: Sep. 24, 2019

(54) METHOD OF FABRICATING INTEGRATED CIRCUIT PACKAGING WITH ETCHED BASE

(71) Applicant: Twisden Ltd., Tortola (VG)

(72) Inventors: Loke Chew Low, Tortola (VG); Poh Cheng Ang, Tortola (VG); Linhui Yuan, Tortola (VG)

(73) Assignee: Twisden Ltd., Tortola (VG)

( * ) Notice: Subject to any disclaimer, the term of this patent is extended or adjusted under 35 U.S.C. 154(b) by 0 days.

(21) Appl. No.: 15/741,154

(22) PCT Filed: Sep. 2, 2015

(86) PCT No.: PCT/MY2015/050096
§ 371 (c)(1),
(2) Date: Dec. 29, 2017

(87) PCT Pub. No.: WO2017/003278
PCT Pub. Date: Jan. 5, 2017

(65) Prior Publication Data
US 2018/0197754 A1    Jul. 12, 2018

(30) Foreign Application Priority Data
Jul. 1, 2015  (MY) .............................. PI2015001708

(51) Int. Cl.
*H05K 1/02* (2006.01)
*H01L 21/48* (2006.01)
(Continued)

(52) U.S. Cl.
CPC ........ *H01L 21/4846* (2013.01); *H01L 21/568* (2013.01); *H01L 23/3107* (2013.01);
(Continued)

(58) Field of Classification Search
CPC ............... H01L 21/4846; H01L 21/568; H01L 23/3107; H01L 23/49838; H05K 1/02; H05K 3/05
(Continued)

(56) References Cited

U.S. PATENT DOCUMENTS 4,480,288 A * 10/1984 Gazdik ............... H01L 21/4846
174/254
5,382,759 A * 1/1995 Kei Lau ............... H01L 21/4857
174/254
(Continued)

FOREIGN PATENT DOCUMENTS

CN           101656249        2/2010

OTHER PUBLICATIONS

English Abstract of CN101656249.
(Continued)

*Primary Examiner* — Andargie M Aychillhum
*Assistant Examiner* — Michael F McAllister
(74) *Attorney, Agent, or Firm* — Preston Smirman; Smirman IP Law, PLLC

(57) ABSTRACT

The present invention relates to an integrated circuit packaging, comprising: a plurality of electrical circuits using a first patterned conductive layer (103) formed by using a masking material (102); a second patterned conductive layer (105) having disposed on at least one side of the first patterned conductive layer (103); and a first dielectric layer (106) made from a laminating means, wherein the first patterned conductive layer (103) and the second patterned conductive layer (105) are disposed within the first dielectric layer (106), such that at least one side of the first dielectric layer (106) are located at the same plane with the first patterned conductive layer (103).

10 Claims, 3 Drawing Sheets

Figure 1:

(51) Int. Cl.
*H01L 23/31* (2006.01)
*H01L 21/56* (2006.01)
*H05K 3/20* (2006.01)
*H01L 23/498* (2006.01)

(52) U.S. Cl.
CPC ......... *H01L 23/49838* (2013.01); *H05K 1/02* (2013.01); *H05K 3/205* (2013.01)

(58) Field of Classification Search
USPC .......................................................... 174/250
See application file for complete search history.

(56) References Cited

U.S. PATENT DOCUMENTS

| | | | | |
|---|---|---|---|---|
| 5,861,322 | A * | 1/1999 | Caillat | H01L 21/4857 438/107 |
| 6,391,220 | B1 * | 5/2002 | Zhang | B32B 37/26 156/247 |
| 6,544,430 | B2 * | 4/2003 | McCormack | B32B 37/26 156/246 |
| 7,327,041 | B2 * | 2/2008 | Dotta | H01L 21/563 257/783 |
| 8,186,049 | B2 * | 5/2012 | Fan | H05K 1/111 29/846 |
| 8,288,246 | B2 * | 10/2012 | Yang | H01L 21/6835 438/455 |
| 2007/0290306 | A1 | 12/2007 | Muramatsu et al. | |
| 2009/0314650 | A1 | 12/2009 | Tseng et al. | |
| 2010/0140772 | A1 * | 6/2010 | Lin | H01L 21/486 257/686 |
| 2011/0084370 | A1 | 4/2011 | Su et al. | |

OTHER PUBLICATIONS

International Search Report dated Dec. 7, 2015.
Written Opinion of International Searching Authority dated Dec. 7, 2015.
International Preliminary Report on Patentability dated Oct. 17, 2017.

* cited by examiner

METHOD OF FABRICATING INTEGRATED CIRCUIT PACKAGING WITH ETCHED BASE

CROSS-REFERENCE TO RELATED APPLICATION

The instant application is a national phase of PCT International Patent Application Serial No. PCT/MY2015/050096 filed Sep. 2, 2015, and claims priority to Malaysian Patent Application Serial No. PI2015001708 filed Jul. 1, 2015, the entire specifications of both of which are expressly incorporated herein by reference.

FIELD OF INVENTION

The invention relates in general to an integrated circuit package and manufacturing method thereof, and more particularly to a carrierless-integrated circuit package having a covering means.

BACKGROUND ART

Recently, there was an increase in the number of terminals and the narrowing of their pitches in the semiconductor or integrated circuit device which result from advancements in the performance of operations, the capability of performing multi tasks and the integration thereof, which results in the growing demands of the interconnecting substrate for packaging which carries the semiconductor device also attains a higher density in arrangement and interconnections.

The current interconnecting substrate for packaging in-use, which are made of build-up multi-layered substrate, a sort of multi-layered interconnecting substrate.

Glass epoxy print substrates which are used as the base core substrate, which build-up multi-layered substrate is fabricated by forming an epoxy resin layer on both surfaces of this glass epoxy print substrate. Then, forming via holes in these epoxy resin layers by means of photolithography or laser. After that, plating method and the photolithography with a combination of the electroless or electrolytic Cu, in which an interconnection layer and via conductors are formed such that the formation of build-up layered structure is archived.

However, the glass epoxy print substrate may cause a problem that the heat treatments performed in fabrication of the build-up multi-layered substrate may bring the glass epoxy print substrate to a poor condition and creating defects. Furthermore, the heat treatments carried out at the time of chip loading and solder reflow may to cause the faulty connection and the distortion which effects the long-term reliability for the connection.

Moreover, the interconnecting substrate for packaging is mounted on an external board or apparatus, the stress is structurally centered on the interface between the external electrode terminal and the insulating layer, which tends to give rise to opening defects so that the satisfactory mounting reliability cannot be obtained.

Therefore the purpose of overcoming the above problems, there have been proposed an integrated circuit package and manufacturing method thereof, and more particularly to a carrierless-integrated circuit package having a covering means.

SUMMARY OF INVENTION

One aspect of the present invention provides a method of fabricating an integrated circuit packaging, comprising steps of: establishing a base; developing a plurality of electrical circuits using a first patterned conductive layer, wherein the electrical circuit are formed by using a masking material; developing a second patterned conductive layer, where second patterned conductive layer is disposed on at least one side of the first patterned conductive layer; developing a first dielectric layer made from a laminating means, wherein the first patterned conductive layer and the second patterned conductive layer are disposed within the first dielectric layer, in which at least one side of the first dielectric layer are located at the same plane with second side of the first patterned conductive layer, such that the first dielectric layer surface area is enclosed on the surface area of the base; and etching the base.

Further, the method of fabricating an integrated circuit packaging, comprising steps of: developing an interconnect on at least one side of the patterned conductive layer.

Preferably, the first patterned conductive layer and the second patterned conductive layer are disposed within the first dielectric layer, in which the other side of the first dielectric layer is located at the same plane with the second side of the second patterned conductive.

Preferably, the thickness of the first dielectric layer reduced by process of trimming at least one surface of the first dielectric layer.

Preferably, the thickness of the second patterned conductive layer reduced by process of trimming at least one surface of the second patterned conductive layer.

Preferably, the process of trimming the surface by using chemical process or mechanical grinding process or laser trimming process or plasma treatment or any combination thereof.

Preferably, the masking material is a mask set or photolithography material or masked pattern or any combination thereof.

Preferably, the base is completely removed.

Preferably, the base is selectively removed, such that the area of the first dielectric layer are exposed to form at least an internal opening or at least a positioning opening or any combination thereof.

Preferably, the base is selectively removed to form at least an internal opening or at least a positioning opening of the first dielectric layer area, wherein the internal opening corresponds with an inside area of the first dielectric layer, or the positioning opening corresponds with an outside area of the first dielectric layer or any combination thereof.

Preferably, the positioning opening is formed using a positioning mark or half-etched indentation or patterns on the base.

Preferably, the base is a charge carrier.

Further, the step of removing the base comprising steps of: etching the base by using the masking material; and removing the masking material.

Preferably, the step of etching the base further comprising steps of: etching part of the first patterned conductive layer so that the surface of the etched first patterned conductive layer and the surface of the etched first dielectric layer are not located at the same plane.

Preferably, the masking material has at least a first opening or at least a second opening, the first opening is corresponding with the inside area of the first dielectric layer, or the second opening is corresponding with the outside area of the first dielectric layer or any combination thereof.

Preferably, the interconnect is a metal finishing or organic finishing or any combination thereof.

Another aspect of the present invention relates to an integrated circuit packaging, comprising: a plurality of electrical circuits using a first patterned conductive layer formed by using a masking material; a second patterned conductive layer having disposed on at least one side of the first patterned conductive layer; and a first dielectric layer made from a laminating means, wherein the first patterned conductive layer and the second patterned conductive layer are disposed within the first dielectric layer, such that at least one side of the first dielectric layer are located at the same plane with the first patterned conductive layer.

Further, the integrated circuit packaging includes a base.

Preferably, the integrated circuit packaging further includes an interconnect on at least one side of the patterned conductive layer.

Preferably, the first dielectric layer has at least one trimmed surface.

Preferably, the second patterned conductive layer has at least one trimmed surface.

Preferably, the trimmed surface of the first dielectric layer is trimmed by using chemical process or mechanical grinding process or laser trimming process or plasma treatment or any combination thereof.

Preferably, the masking material is a mask set or photolithography material or masked pattern or any combination thereof.

Preferably, the base is selectively removed base, to form at least an internal opening or at least a positioning opening or any combination thereof of the first dielectric layer exposed area.

Preferably, the base is selectively removed base, to form at least an internal opening or at least a positioning opening or any combination thereof of the first dielectric layer exposed area, wherein the internal opening corresponds with an inside area of the first dielectric layer, or the positioning opening corresponds with an outside area of the first dielectric layer.

Preferably, the first patterned conductive layer and the second patterned conductive layer are disposed within the first dielectric layer, in which the other side of the first dielectric layer is located at the same plane with the second side of the second patterned conductive.

Preferably, the first dielectric layer are exposed to form at least an internal opening or at least a positioning opening or any combination thereof by a selectively removing the base.

Preferably, the base is a selectively removed base that forms at least an internal opening or at least a positioning opening or any combination thereof, wherein the internal opening corresponds with an inside area of the first dielectric layer, or the positioning opening corresponds with an outside area of the first dielectric layer.

Preferably, the internal opening or positioning opening has a positioning mark or half-etched indentation or patterns on the first dielectric layer.

Preferably, the base is a charge carrier.

Preferably, the base etched using the masking material.

Preferably, the dielectric layer is a thin-film encapsulation.

Preferably, the interconnect is a metal finishing or organic finishing or any combination thereof.

The present invention consists of features and a combination of parts hereinafter fully described and illustrated in the accompanying drawings, it being understood that various changes in the details may be made without departing from the scope of the invention or sacrificing any of the advantages of the present invention.

BRIEF DESCRIPTION OF PREFERRED EMBODIMENT

To further clarify various aspects of some embodiments of the present invention, a more particular description of the invention will be rendered by references to specific embodiments thereof, which are illustrated in the appended drawings. It is appreciated that these drawings depict only typical embodiments of the invention and are therefore not to be considered limiting of its scope. The invention will be described and explained with additional specificity and detail through the accompanying drawings in which:

FIG. 1 to FIG. 12 are detailed process flowcharts of manufacturing and connecting for an integrated circuit package according to a first embodiment of the invention.

DETAILED DESCRIPTION OF THE PREFERRED EMBODIMENTS

Figure 2:

The FIG. 1 illustrates the process flowcharts of manufacturing an integrated circuit package according to at least one embodiment of the invention. Firstly, a carrier or base (101) is established or developed, wherein the base (101) is a steel material or copper or conductive material such as charge carrier. Then, FIG. 2 illustrates a layers of photo-resist materials (102) is developed on the base (101), in which the layer is then developed or formed as a patterned layers of photo-resist materials (102'). Alternatively, the layers of photo-resist materials (102) are also formed on both surfaces of the carrier or base (101), bottom part and top part. The purpose of photo-resist materials (102) on the top portion is to create a masking for circuit patterning. However, the photo-resist materials (102) on the bottom portion are to avoid unnecessary buildup of plating material to avoid wastage of the plating material. This photo-resist materials (102) has to on the bottom portion of the carrier or base (101) until demasking process.

Figure 3:
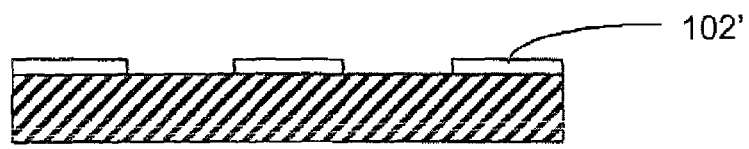
Figure 4:
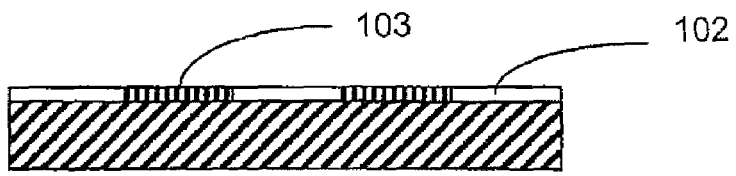

The FIG. 3 illustrate developed of an electrically conductive layer (103) in the removed or etched part of the layers of photo-resist materials (102'), wherein the electrically conductive layer (103) developed by using electroplating method. Thereafter, the layers of photo-resist materials (102') will be removed, leaving the electrically conductive layer (103) wherein the first conductive layer and used as electrical circuits or electrical routing as illustrated in FIG. 4. The layers of photo-resist materials (102') on the bottom part of the carrier or base (101) will still remain.

Then, the electrically conductive layer (103) is develop into a plurality of electrical circuits, which are electrically isolated and used as a package trace layout unit or electrical circuits unit, wherein the electrical circuits unit will be electrically connected to each other. This formation has same pattern to the integrated circuit that are ready for packaging.

Figure 5:
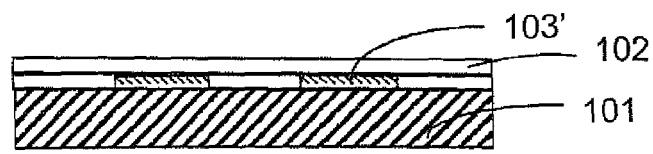
Figure 6:
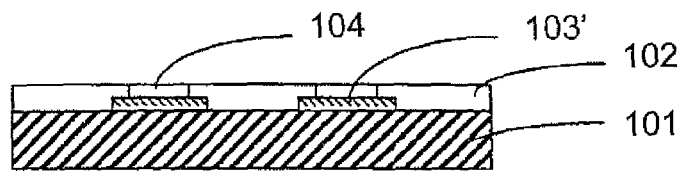

The FIG. 5 illustrates, a layer photo-resist material (102) disposed on the surface of the first electrically conductive layer (103'), and a cavity (104') is developed on the patterned photo-resist material (102). Then another conductive layer (105) is developed or disposed in the cavity (104') as shown in FIG. 6, wherein the second conductive layer (105) is developed by way of electroplating. This layer photo-resist material (102) could be a second layer on top of the first layer of a layer photo-resist material (102) as shown in FIG. 4.

Figure 7:
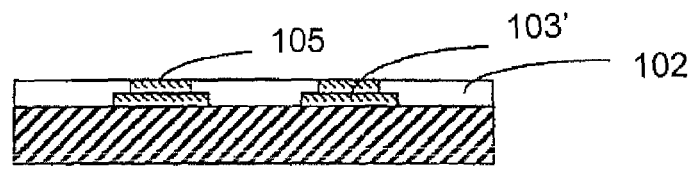

The second patterned conductive layer (105) will be disposed within the first dielectric layer (106), in which at least one side of the first dielectric layer (106) are located at the same plane with second side of the first patterned conductive layer (103) and the other side of the first dielectric layer (106) are located at the same plane with the second side of the second patterned conductive layer (105), such that the first dielectric layer (106) surface area is enclosed within the surface area of the base as illustrate in FIG. 7.

Figure 8:
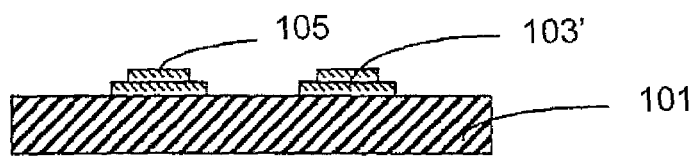

The photo-resist material (102) will be then removed so that a patterned first electrically conductive layer (103') and a second conductive layer (105) are obtained as indicated in FIG. 8. The photo-resist material (102) could be more that one layer, as mentioned in the FIG. 5.

Figure 9:
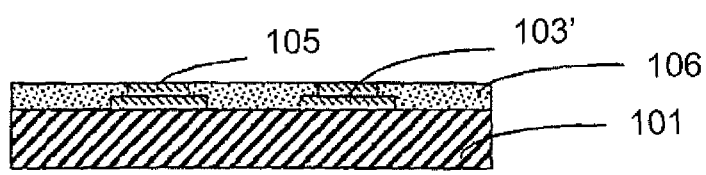

Thereafter, a covering means or molding material or laminating material is injected to develop a first dielectric layer (106), such that the patterned first electrically conductive layer (103') and the second conductive layer (105) are embedded within the first dielectric layer (106), as illustrated in FIG. 9. The covering means used to form the first dielectric layer (106) is molding material such as epoxy resin or lamination material which obtained from lamination process using a vacuum hot press or any other suitable means. The first dielectric layer (106) my extend beyond the second conductive layer (105) or embedded lower than the second conductive layer (105).

Figure 10:
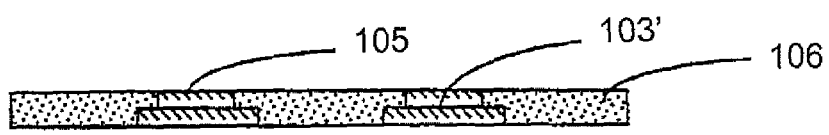

As illustrated in FIG. 10, the base or carrier (101) is removed to obtain an integrated circuit package by performing a etching process. The base or carrier (101) may be removed only partially. The removal process may be performed by using a layer photo-resist material (102).

Figure 11:
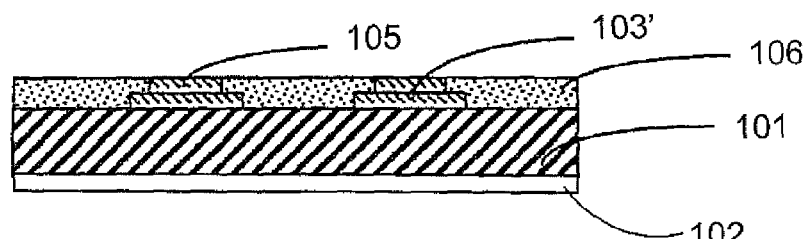

In an alternative embodiment, a covering means or molding material or laminating material is injected to develop a first dielectric layer (106), such that the patterned first electrically conductive layer (103') and the second conductive layer (105) are embedded within the first dielectric layer (106) and the base or carrier (101) has a layer photo-resist material (102) disposed at the bottom surface of the base or carrier (101), as illustrated in FIG. 11.

Figure 12:
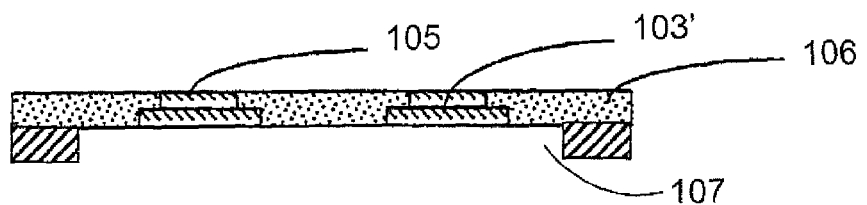

The base (101) can be removed selectively to form at least an internal opening and at least a positioning opening, wherein the internal opening corresponds with an inside area of the first dielectric layer (106), and the positioning opening corresponds with an outside area of the first dielectric layer (106). The base (101) also can be removing at least one part of the first dielectric layer (106), such that the area of the first dielectric layer (106) are exposed to form at least an internal opening (107) and at least a positioning opening (107) or at least a internal opening (107) or positioning opening (107) as illustrated in FIG. 12.

One aspect of the present invention relates to an integrated circuit or semiconductor or electronic circuit packaging having a plurality of electrical circuits using a first conductive layer which obtained from the patterning process, wherein each of the electrical circuit is formed by a plurality of dielectric layers- or routing. The integrated circuit also includes a second patterned conductive layer, where at least one side or bottom portion of the second patterned conductive layer disposed on at least one side or top portion of the first patterned conductive layer; and a first dielectric or insulating layer made of a molding means such as lamination material or molding material. The molding process is performed by injecting or enclosing using a suitable molding material. The first patterned conductive layer and the second patterned conductive layer are placed or formed in such a way that it disposed on the first dielectric layer, in which at least one side of the first dielectric layer are located at the same plane or almost equal plane with second side of the first patterned conductive layer and the other side of the first dielectric layer are located at the same plane or almost equal plane with the second side of the second patterned conductive, and at least one part or portion of the first dielectric layer has at least an internal opening and at least a positioning opening formed.

Another aspect of the present invention relates to an integrated circuit or semiconductor or electronic circuit packaging having a plurality of electrically isolated circuits using a first conductive layer which obtained from the patterning process, wherein each of the electrically isolated circuit is formed by a plurality of dielectric layers or routing. The first conductive layer has a base and a first connecting layer. The integrated circuit also includes a second patterned conductive layer having second conductive layer and a top layer, where the second connecting layer or bottom portion of the second patterned conductive layer disposed on the first connecting layer or top portion of the first patterned conductive layer. The integrated circuit also includes a first dielectric or insulating layer made of a covering means such as lamination material. The lamination process is accomplished by using the vacuum hot press on the lamination material. The first patterned conductive layer and the second patterned conductive layer are placed or formed in such a way that it disposed on the first dielectric layer, in which at least one side or portion of the first dielectric layer are located at the same plane or almost equal plane with base or second side of the first patterned conductive layer and the other side of the first dielectric layer are Located at the same plane or almost equal plane with the top portion or second side of the second patterned conductive layer, and at least one part or portion of the first dielectric layer has at least an internal opening and at least a positioning opening formed, preferably away from the conductive layers. The first dielectric layer has at least one grinded surface.

The present invention may be embodied in other specific forms without departing from its essential characteristics. The described embodiments are to be considered in all respects only as illustrative and not restrictive. The scope of the invention is, therefore indicated by the appended claims rather than by the foregoing description. All changes, which come within the meaning and range of equivalency of the claims, are to be embraced within their scope.

The invention claimed is:

1. An integrated circuit packaging, comprising:
a plurality of electrical circuits using a first patterned conductive layer formed by using a masking material on a base, wherein the base is a charge carrier and is completely or selectively removed;
wherein the first patterned conductive layer includes a first portion and a second portion, wherein the first and second portions of the first patterned conductive layer are spaced apart from one another and do not contact one another;
a second patterned conductive layer disposed on a surface of the first patterned conductive layer;
wherein the second patterned conductive layer includes a first portion and a second portion, wherein the first and second portions of the second patterned conductive layer are spaced apart from one another and do not contact one another; and
a dielectric layer made from a laminating means, wherein the first patterned conductive layer and the second patterned conductive layer are disposed within the dielectric layer through a lamination process, such that a surface of the dielectric layer is co-planar with a surface of the first patterned conductive layer;

wherein the dielectric layer is ground to expose the second pattern conductive layer and achieve a uniform surface of pre-determined thickness.

2. The integrated circuit packaging according to claim 1, further comprising an interconnect on a side of the first or second patterned conductive layers.

3. The integrated circuit packaging according to claim 1, wherein the masking material is a mask set, a photolithography material, a masked pattern, and any combination thereof.

4. The integrated circuit packaging according to claim 1, wherein the base is selectively removed to form at least an internal opening or at least a positioning opening, or any combination thereof, of the dielectric layer exposed area, wherein the internal opening corresponds with an inside area of the dielectric layer or the positioning opening corresponds with an outside area of the dielectric layer.

5. The integrated circuit packaging according to claim 1, wherein a surface of the dielectric layer is co-planar with a surface of the second patterned conductive.

6. The integrated circuit packaging according to claim 1, wherein the dielectric layer is exposed to form at least an internal opening, at least a positioning opening, or any combination thereof, by a selectively removing the base.

7. The integrated circuit package according to claim 4, wherein the internal opening or positioning opening has a positioning mark or half-etched indentation or patterns on the dielectric layer.

8. The integrated circuit packaging according to claim 1, wherein the base is etched using the masking material.

9. The integrated circuit packaging according to claim 1, wherein the dielectric layer is a thin-film encapsulation.

10. The integrated circuit packaging according to claim 2, wherein the interconnect includes a metal finishing, organic finishing, and any combination thereof.

* * * * *